INVENTORS:
Heribert Rümmer
Werner Blumann
Richard Weist
BY Spencer & Kaye
Attorneys INVENTORS:
Heribert Rümmer
Werner Blumann
Richard Weist
BY Spencer & Kaye
Attorneys United States Patent Office 3,559,118

Patented Jan. 26, 1971

3,559,118

SWITCHING AND TUNING DEVICE HAVING ROTATABLE PUSHBUTTON ASSOCIATED WITH EACH POTENTIOMETER

Heribert Rümmer, Ingolstadt, Werner Blumann, Nuremberg, and Richard Weist, Erlangen, Germany, assignors to Telefunken Patentverwertungsgesellschaft m.b.H., Ulm (Danube), Germany Filed June 10, 1968, Ser. No. 735,732
Claims priority, application Germany, June 10, 1967, P 15 91 682.2; Aug. 25, 1967, P 15 91 713.2
Int. Cl. H03j *5/32;* H03h *5/12*
U.S. Cl. 334—7 17 Claims

ABSTRACT OF THE DISCLOSURE

A switching and tuning device for a television or radio receiver having voltage-dependent tuning means. The device is equipped with a plurality of like switching units arranged in a housing, each of which units has a potentiometer, indicating means which show the setting of the potentiometer, push-button means associated with the potentiometer for connecting the same to the tuning means, and an acuating key which is pivotally mounted on the housing and which depresses the push-button means. The actuating key itself forms part of a cover for the housing and normally overlies the indicating means but is raisable to expose the same. Latching means coact with all of the switching units for holding the push-button means of any actuated unit in depressed position. Upon the actuation of the actuating key of a different unit, the previously depressed push-button means is released and the push-button means of the newly actuated unit is held in depressed position. As a space saving feature, the indicating means of the potentiometers, which are in the form of discs, are staggered in height and overlap each other.

BACKGROUND OF THE INVENTION

The present invention relates to a switching and tuning device for receivers, particularly television and radio receivers having voltage-dependent tuning elements such as variable capacitance diodes, which device has a plurality of potentiometers which are equipped with indicating scales and which serve for setting the voltage that is applied to the voltage-dependent elements, which potentiometers are switched in upon the actuation of associated control elements.

There exist various types of push-button switches for use in television receivers in which a given frequency band is preselected by rotating a push button, which frequency band is then switched when the push button is depressed. When the button is depressed, a tuning spindle is connected with a tuning knob which itself is common to all of the push buttons. A desired channel in the selected frequency band can then be tuned in by turning the tuning knob, this being done by changing the position of a travelling nut which is mounted on the tuning spindle.

There also exist switching and tuning devices for use with tunable-diode type channel selectors in which the slides of the potentiometers are driven by means of a spindle and in which the slides themselves move along a scale and themselves serve as indicators. In order to obtain a sufficiently large scale, the spindle as well as the associated potentiometer wire has to be very long. This brings with it the inherent drawback that the stability and rigidity of the spindles are reduced, and this, in turn, adversely affects the precision with which the set is tuned to the desired frequency upon each actuation of the switching and tuning device. While this could be prevented by providing short spindles and by enlarging the indication by mechanically amplifying the movement, this is counterbalanced by the need to provide the additional mechanical parts.

SUMMARY OF THE INVENTION

It is, therefore, the primary object of the present invention to provide a switching and tuning device for use in electronically tunable television and radio receivers, which device is compact, which can readily be built into practically any type of housing, which can be provided with structurally simple control means, and which has an indicating scale or dial that can easily be read without it being necessary to provide any elements which mechanically amplify the motion.

Accordingly, the present invention resides in a switching and tuning device for a television or radio receiver having voltage-depending tuning means. The device is equipped with a plurality of like switching units arranged in a housing, each of which units has a potentiometer, indicating means which show the setting of the potentiometer, push-button means associated with the potentiometer for connecting the same to the tuning means, and an actuating key which is pivotally mounted on the housing and which depresses the push-button means. The actuating key itself forms part of a cover for the housing and normally overlies the indicating means but is raisable to expose the same. Latching means coact with all of the switching units for holding the push-button means of any actuated unit in depressed position. Upon the actuation of the actuating key of a different unit, the previously depressed push-button means is released and the push-button means of the newly actuated unit is held in depressed position. As a space saving feature, the indicating means of the potentiometers, which are in the form of discs, are staggered in height and overlap each other.

DETAILED DESCRIPTION OF THE PREFERRED EMBODIMENTS

Figure 1:
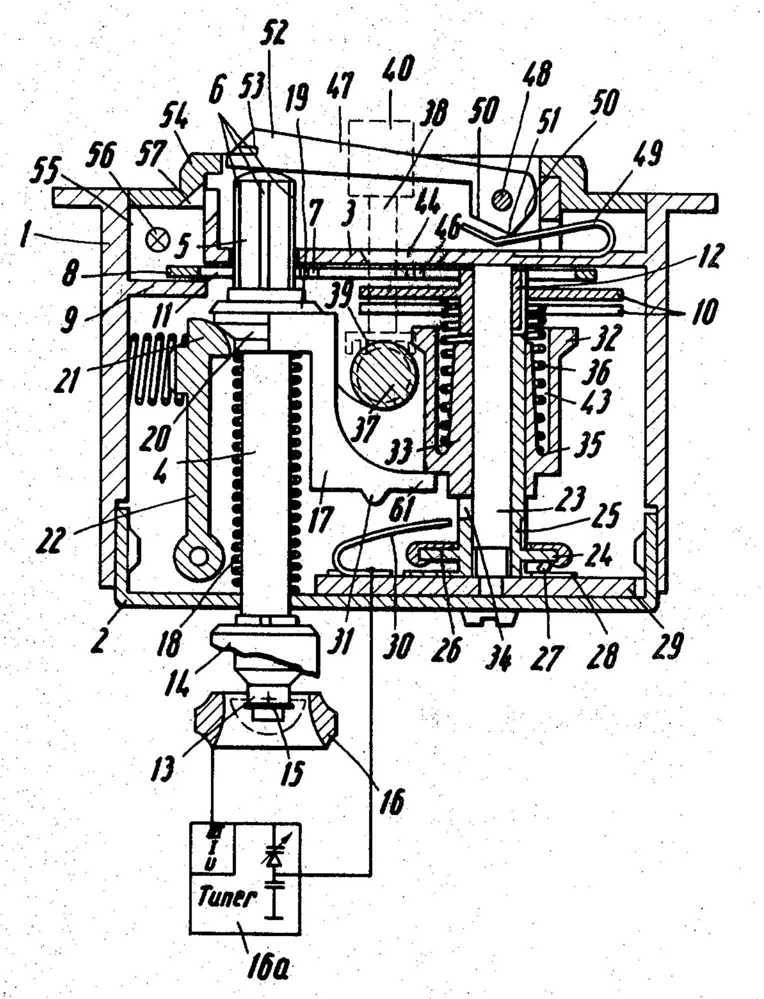
FIG. 1 is a sectional view of one embodiment of a switching and tuning device according to the persent invention.

Referring now to the drawings, the same show a housing 1 of a switching and tuning device for a tunable-diode type tuning device which is particularly adapted for use in television receivers. The housing 1 is closed at the bottom by means of a flanged bottom plate 2 and is provided with an interior wall 3. Arranged in the housing are a plurality of like switching units each having a push-button switching shaft 4 which is rotatably and axially movably supported by the plate 2 and the wall 3. The upper end 5 of the shaft 4 projects beyond the wall 3 and carries a plurality of projections 6 which are evenly distributed about the circumference of the shaft end 5 and which, upon rotation of the shaft 4, mesh with cut-outs 7 of a frequency band indicator slide 8. The latter extends parallel to the interior wall 3 and is held in position by means of a tongue 9 and an indicator disc 10. The disc 10 shown in full lines in FIG. 1 is part of the switching unit directly behind the unit shown in cross-section. The discs 10 are axially offset from each other so that they can overlap and, thus, form a more compact unit. This overlap is clearly shown in FIG. 2. All the other parts of the switching unit of which the full-lined disc 10 is a part are hidden from view in FIG. 1. The slide 8 is further provided with a slot 11, through which extends the end 5 of shaft 4 as well as the hub 12 of the indicator disc 10, so that the slide is slidably mounted for movement in the direction of its length.

The lower end 13 of shaft 4, as viewed in FIG. 1, has secured to it a cam disc 14 which is rotatable together with the shaft 4 and which coacts with a pivotally mounted rocker 16. The latter is operatively associated with a band selector switch, shown schematically at **16*a*, so that this band selector switch 16*a* is actuated through the intermediary of the rocker 16**.

A coupling member 17 rides loosely on the shaft 4 and engages a collar 19 that is provided on the shaft 4. The coupling member is engaged by a presseure-exerting spring 18 which is interposed between the coupling member 17 and the bottom plate 2. The left side of the member 17 is provided with an oblique abutting surface 20 which coacts with the outer surface of a hook 21 of a latch plate 22 which coacts with the collars 19 of the shafts 4 of all of the switching units (see FIG. 3). When the shaft 4 is in its depressed position, the hook 21 comes to lie behind the collar 19 and thus maintains the shaft 4 in such position.

The indicator disc 10 is loosely mounted on a pin 23 which itself is secured between the bottom plate 2 and the wall 3. In practice, the wall 3 and the pin 23 will consist of a single piece of molded plastic; if desired, there may be provided a single molded piece which constitutes the housing 1, the wall 3 and the pin 23. A sleeve 25 having a disc-shaped flange part 24 is loosely mounted on the pin 23 below the hub 12. The part 24 is circular and carries a contact ring 26, the latter being equipped with a resilient wiper arm 27 which slides on an annular resistor 28 which serves as a potentiometer. The resistor is carried by a carrier plate 29 which will, in practice, carry the potentiometer resistors of the other units as well. The carrier plate 29 also carries a resilient, movable contact arm 30 which, when engaged by a projection 31 of the member 17, is pressed against the contact ring 26.

The coupling member 17 has a finger 61 which engages the underside of a gear 32 which is rotatably and axially displaceably mounted on the pin 23. The gear 32 is provided with several, preferably three, symmetrically arranged and inwardly extending longitudinal strips 33 which ride in slots 34 of the sleeve 25, the inner edges of these strips sliding on the pin 23. The gear 32 thus has a hollow interior 43 within which is arranged a pressure exerting spring 36, the latter being interposed between the lower inner surface 35 of the gear 32 and the underside of the indicator disc 10. In this way, the gear 32 is pressed downwardly from above against the finger 61 of the coupling member 17.

A threaded spindle 37 is arranged at right angles to the pin 23 of each of the switching units (see FIG. 3), the spindle being so located that the gear 32 can be slid axially to engage the spindle. The spindle 37 can be rotated by means of an actuating shaft 38 which extends in the direction of the pin 23, there being suitable gearing 39 at the bottom of the shaft 38 to turn the spindle 37 and an actuating knob 40 at the top of shaft 38.

Figure 3:
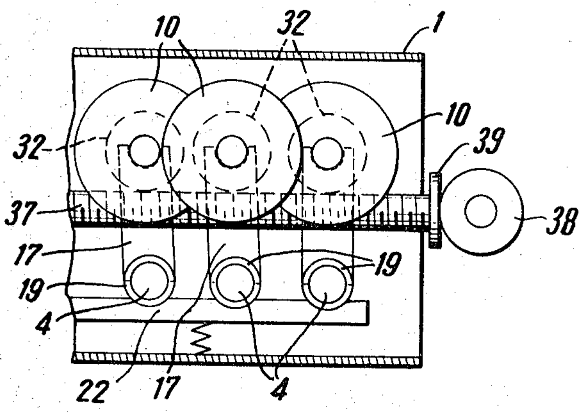
FIG. 3 is a partial plan view schematically showing the arrangement of a plurality of units.

As set forth above and shown in FIG. 3, the device according to the present invention incorporates a plurality of like switching units, all located within the housing 1. As shown in the drawings, the indicator discs 10 are staggered in height, so that adjacent discs 10 overlap each other. In order to eliminate the need for different parts, the discs 10 are not centered with respect to their own hubs 12 but are arranged at a point spaced from the axial midpoint of the respective hub, so that each hub extends different lengths from opposite sides of the discs 10. In this way, the axial positions of adjacent discs 10 can be staggered with respect to each other simply by positioning the hubs of alternate units with the shorter and longer lengths extending in the same direction. The discs 10 of adjacent units will thus overlap each other, thereby realizing a significant saving in space.

Figure 2:
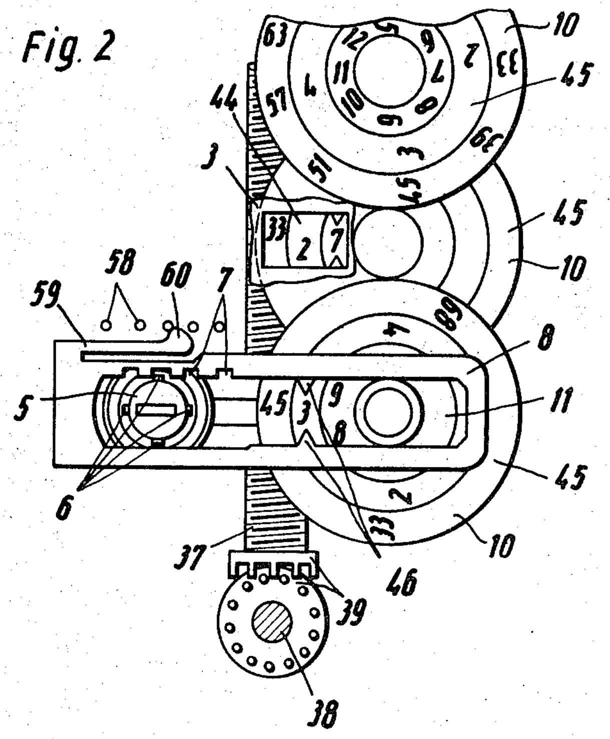
FIG. 2 is a plan view of some of the component parts shown in FIG. 1.

The wall 3 is provided with an opening 44 which overlies the indicator discs 10, so that, as is best seen from FIG. 2, a portion of the indicating scale 45 carried by each disc 10 can be seen from above. Each indicating scale 45 is divided into annular regions, each of which pertains to a respective frequency band. The slide 8 is provided with arrowhead-like pointers 46 which are directed inwardly into the slot 11 and which indicate the particular frequency band which is switched in, so that, depending on the position of the slide 8, there will be obtained an indication of the channel and frequency band to which the set is tuned.

Each unit has an actuating key 47 which serves as part of the cover for the housing 1 and which is arranged above the wall 3 and is pivotally mounted on a bearing 48. The key 47 coacts with a spring 49 so that the key can kept in detented positions, this being brought about by two surfaces 50 which form an abtuse angle with each other and come to a point 51. The free end 52 of the key 47 overlies and engages the upper end 5 of the shaft 4, so that the shaft 4 can be actuated by depressing the key 47. The key 47 can be put into an upright position in order to allow the shaft 4 to be rotated about its own axis so as to change the frequency band. To facilitate manual lifting of the key 47, the free end 52 is provided with a slit 53.

According to a further feature of the present invention, a light channel 55 is formed by the housing, or by means of separate light guides. In the embodiment of FIG. 1, this light channel is formed by means of a closure 54. A light source 56 is arranged within the light channel 55, the light from this source passing through an opening 57 in the housing and/or light guides and being visible from the outside whenever a respective actuating key 47 is depressed.

The switching and tuning device described above operates as follows:

When the key 47 of a given unit is depressed, the shaft 4 is moved downwardly as a result of which the abutment surface 20 causes the latch plate 22 to be moved outwardly and beyond the collar 19, so that the hook 21 can come to lie behind (i.e., above) the collar 19 and thereby hold the shaft 4 in its depressed position against the action of the spring 18. The key 47 itself is held in its depressed position by the detenting action of the spring 49. As the shaft 4 is depressed, the cam 14 pivots the rocker 16 in clockwise direction and, in such position, switches in the desired frequency band, e.g., Band I in the case of television receivers intended for use in Europe where Band I is one of several available bands, or the VHF band in the case of a VHF–UHF receiver intended for use in the United States. At the same time, the projection 31 presses the contact arm 30 against the contact ring 26, thereby electrically conecting the potentiometer, via contact spring 27, to the tuning element in the tuner, shown here as a capacitance diode. Also at the same time, the gear 32 will slide downwardly on the pin 23 under the influence of the spring 36—the finger 61 of coupling member 17 having moved down—so that the teeth of the gear 32 will come into mesh with the threads of the spindle 37. The gear 32 can then be turned by rotating the spindle 37 via the knob 40, so that the position of the slide of the potentiometer is varied, which, in turn, allows a different voltage to be applied to the tuning element, thereby to tune the device to a different channel. Whatever channel the tuner is now tuned to will remain stored in the potentiometer. When the actuating key 47 is raised up, the frequency band and the channel can be read off through the opening 44 between the pointers 46.

If, now, another key 47 is depressed, the shaft 4 of the previously actuated unit is released inasmuch as the latch plate 22 will be moved leftwardly under the influence of the descending shaft 4 of the newly actuated unit. The plate 22 returns to its illustrated position under the influence of the return spring 18 and will hold in depressed position the shaft 4 of the newly actuated unit. In this way, the potentiometer of the previously actuated unit will, due to the upwardly travel of the coupling element 17 and hence the release of the spring arm 30, be disconnected from the tuner **16*a***.

When a key 47 is raised, the respective shaft 4 can be rotated so that another frequency band will be switched in. The cam 14 carried by the respective shaft 4 will be turned so that when the shaft 4 is in the process of being depressed, or is in its depressed position, the rocker 16 will assume a different pivoted position so as to change the tuner **16*a* over to a different band. Turning the shaft 4 causes the associated slide 8** to move rightwardly or leftwardly, as the case may be, so that an indication is obtained of the newly switched-in frequency band.

Slide 8 is provided with detent means for fixing the positions which the slide occupies. These detent means are constituted by pins 58, shown in FIG. 2, which coact with a projection 60 carried by a resilient arm 59 of the slide 8, the projection being so arranged as to come to lie between adjacent pins 58.

It will be understood that the above description of the present invention is susceptible to various modifications, changes and adaptations, and the same are intended to be comprehended within the meaning and range of equivalents of the appended claims.

We claim:

1. In a switching and tuning device for a television or radio receiver having voltage-dependent tuning means, the combination which comprises:

(a) a housing;

(b) a plurality of switching units arranged in said housing, each switching unit incorporating (1) a potentiometer;

(2) indicating means associated with said potentiometer for indicating the setting thereof;

(3) push-button means associated with said potentiometer for connecting the same to the tuning means, said push-button means turnable in every setting of the potentiometer to different angular positions and being in operative connection with a switching member to place a frequency range switch into different switching positions as a function of the angular position of said push-button means when it is depressed;

(4) an actuating key pivotally mounted on said housing and forming part of a cover therefor for depressing said push-button means, thereby to connect said potentiometer to the tuning means, said actuating key normally overlying said indicating means but being raisable to expose said indicating means; and (5) detent means for holding said actuating key both in its depressed position and in its raised position; and (c) latching means operatively associated with all of said plurality of switching units for holding the push-button means of any actuated unit in depressed position and, upon the actuation of the actuating key of a different unit, releasing the previously depressed push-button means and holding in depressed position the push-button means of the newly actuated unit.

2. The combination defined in claim 1 wherein each potentiometer includes rotatable setting means, wherein the axes of said setting means are aligned with each other, wherein each indicating means includes an indicating disc which is connected to the respective rotatable setting means for rotation therewith, and wherein the indicating discs of adjacent potentiometers are in different axial positions and overlap each other.

3. The combination defined in claim 2 wherein said housing includes an interior wall overlying said indicating means, said wall including an opening through which said indicating means are visible when said actuating key is raised.

4. The combination defined in claim 2 wherein each rotatable setting means includes a gear which is rotatable with the respective potentiometer for setting the same and which is axially displaceable relative thereto, wherein said gear is axially displaced upon actuation of the respective push-button means, and wherein there is provided a tuning spindle which is rotatably mounted in said housing and which is engaged by each respective gear when the same is in its axially displaced position, thereby to allow the gear of an actuated unit, and with it the potentiometer, to be adjusted by rotation of said spindle, whereby each unit may be preset to apply a desired voltage to the tuning means.

5. The combination defined in claim 2 wherein said potentiometers are rotary potentiometers which are aligned with each other, and wherein each indicating disc is coupled to the respective rotary potentiometer.

6. The combination defined in claim 5 wherein each of said potentiometers includes a respective bearing pin, wherein each indicating means includes a hub rotatably mounted on the respective bearing pin, and wherein each disc is arranged on the respective hub at a point spaced from the axial mid-point thereof, in consequence of which each hub extends different lengths from opposite sides of the disc, the hubs of alternate units being positioned with shorter and longer lengths extending in the same direction, whereby the axial positions of adjacent discs are staggered with respect to each other.

7. The combination defined in claim 1 wherein said push-button means are arranged in alignment next to each other.

8. The combination defined in claim 1 wherein each unit further includes return spring means associated with its respective actuating key.

9. The combination defined in claim 1 wherein said push-button means comprise a longitudinally movable switching element and a coupling member interposed between said switching element and said potentiometer for electrically connecting the latter to the tuning means when said actuating key longitudinally moves said switching element.

10. The combination defined in claim 9 wherein said switching element is a rotatable shaft connected to the tuning means for changing the frequency band thereof when said shaft is rotated, and where detent means are provided for maintaining said shaft in predetermined rotational positions.

11. The combination defined in claim 10 wherein said latching means engage said shaft of each unit.

12. The combination defined in claim 10 wherein said shaft is arranged to engage said tuning means for changing the frequency band thereof only when said shaft is in its depressed position.

13. The combination defined in claim 10 wherein each switching unit further comprises an indicator slide movable upon rotation of said shaft for indicating on said indicating means of said potentiometer the frequency band to which the tuning means is set.

14. The combination defined in claim 1 wherein said housing is provided with means forming a light channel containing a light source, there being in the region of each respective actuated key an opening which, upon depression of the respective actuator key, is uncovered, thereby to give a visual and illuminated indication of the depression of any one of said actuator keys.

15. The combination defined in claim 1 wherein said potentiometer can be adjusted by said push-button means to a plurality of different frequency bands and is continuously tunable over each frequency band.

16. In a switching and tuning device for a television or radio receiver having voltage-dependent tuning means, the combination which comprises:

(a) a housing (b) a plurality of switching units arranged in said housing, each switching unit incorporating (1) a potentiometer having rotatable setting means with the axis of said setting means axially aligned with the axes of the setting means in each of the other switching units;

(2) indicating means associated with said potentiometer for indicating the setting thereof and having an indicating disc connected to said rotatable setting means for rotation therewith, said indicating disc being mounted in a different axial position than the discs of adjacent units, so that the adjacent discs are in an overlapping relationship with respect to each other;

(3) push-button means associated with said potentiometer for connecting the same to the tuning means; and (4) an actuating key pivotally mounted on said housing and forming part of a cover therefor for depressing said push-button means, thereby to connect said potentiometer to the tuning, means, said actuating key normally overlying said indicating means but being raisable to expose said indicating means; and (c) latching means operatively associated with all of said plurality of switching units for holding the push-button means of any actuated unit in depressed position and, upon the actuation of the actuating key of a different unit, releasing the previously depressed push-button means and holding in depressed position the push-button means of the newly actuated unit.

17. In a switching and tuning device for a television or radio receiver having voltage-dependent tuning means, the combination with comprises:

(a) a housing;

(b) a plurality of switching units arranged in said housing, each switching unit incorporating (1) a potentiometer continuously settable over a predetermined range by means common to the potentiometers of each of said switching units;

(2) indicating means associated with said potentiometer for indicating the setting thereof;

(3) push-button means associated with said potentiometer for connecting the same to the tuning means, said push-button means turnable in every setting of the potentiometer to different angular positions and being operative for placing a frequency range switch into different predetermined range positions as a function of the angular position of said push-button means when it is depressed; and (4) an actuating key pivotally mounted on said housing and forming part of a cover therefor for depressing said push-button means, thereby to connect said potentiometer to the tuning means, said actuating key normally overlying said indicating means but being raisable to expose said indicating means; and (c) latching means operatively associated with all of said plurality of switching units for holding the push-button means of any actuated unit in depressed position and, upon the actuation of the actuating key of a different unit, releasing the previously depressed push-button means and holding in depressed position the push-button means of the newly actuated unit.

References Cited

UNITED STATES PATENTS 3,439,292 4/1969 Henry ---------------- 334—7

FOREIGN PATENTS 53,745 2/1967 Germany ------------ 334—15
1,246,091 8/1967 Germany ------------- 334—7

PAUL L. GENSLER, Primary Examiner

U.S. Cl. X.R.

74—10.33; 334—15, 87